United States Patent [19]

D'Amico

[11] Patent Number: 5,221,209
[45] Date of Patent: Jun. 22, 1993

[54] MODULAR PAD ARRAY INTERFACE

[75] Inventor: Richard J. D'Amico, Cranston, R.I.

[73] Assignee: Augat Inc., Mansfield, Mass.

[21] Appl. No.: 805,366

[22] Filed: Dec. 11, 1991

Related U.S. Application Data

[63] Continuation-in-part of Ser. No. 748,505, Aug. 22, 1991.

[51] Int. Cl.$^5$ .................... H01R 9/09; H01R 23/72
[52] U.S. Cl. ........................................ 439/71; 439/66
[58] Field of Search .................... 439/66, 68-73, 439/330, 331, 525, 526

[56] References Cited

U.S. PATENT DOCUMENTS

| | | | |
|---|---|---|---|
| 3,290,636 | 12/1966 | Overtveld | 439/700 |
| 3,771,109 | 11/1973 | Bruckner et al. | 439/71 |
| 4,220,383 | 9/1980 | Scheingold et al. | 439/71 |
| 4,354,720 | 10/1982 | Bakermans | 339/91 R |
| 4,504,105 | 3/1985 | Barkus et al. | 339/75 MP |
| 4,552,422 | 11/1985 | Bennett et al. | 439/70 |
| 4,636,026 | 1/1987 | Cooney et al. | 339/255 R |
| 4,679,118 | 7/1987 | Johnson et al. | 361/386 |
| 4,744,009 | 5/1988 | Grabbe et al. | 439/72 |
| 4,761,140 | 8/1988 | Geib | 439/71 |
| 4,838,801 | 6/1989 | Bertoglio et al. | 439/83 |
| 4,906,194 | 3/1990 | Grabbe | 439/71 |
| 4,928,199 | 5/1990 | Diaz et al. | 361/56 |
| 4,929,194 | 5/1990 | Korsunsky et al. | 439/571 |

FOREIGN PATENT DOCUMENTS 8500043  8/1986  Netherlands ................. 439/717

Primary Examiner—Neil Abrams
Attorney, Agent, or Firm—Weingarten, Schurgin, Gagnebin & Hayes

[57] ABSTRACT

A leadless component socket comprises a one- or two-piece leadless component contact socket assembly having a plurality of holes with a respective plurality of spring contacts disposed therein. The socket assembly includes a finger slot or slots to facilitate the manual removal of a chip carrier from the socket and a bias clip and integral keyed corner for assuring proper alignment of the chip carrier with the contacts of the socket assembly. The socket further comprises a cover, a cover support, an insulator assembly and a backup plate or other fastening means for supporting the socket on a printed circuit board. The socket assembly can be configured with a variety of contact terminal ends adapted for a desired mode of circuit board interface. A variety of cover configurations are also accommodated and disclosed. The socket disclosed includes implementations of modular pad array interface for board-to-flex circuit; board-to-board; and board to multi-chip module applications utilizing alternative configurations of substantially rectangular modular blocks.

14 Claims, 14 Drawing Sheets

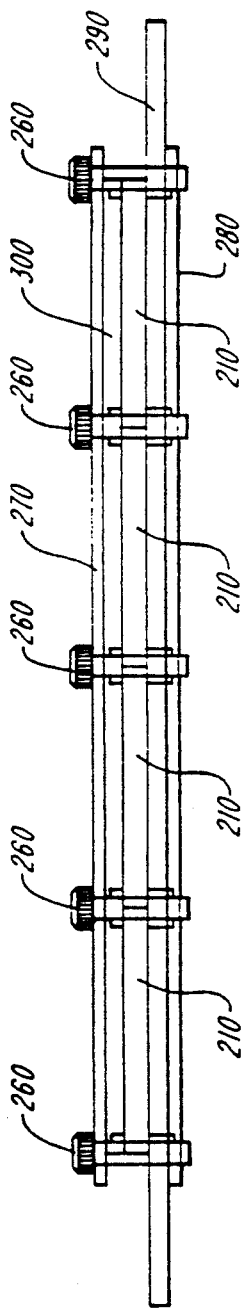
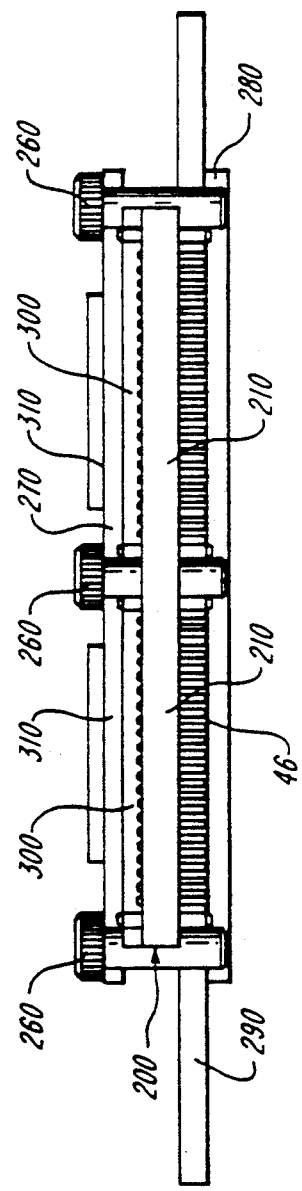
FIG. 11A
FIG. 11B

MODULAR PAD ARRAY INTERFACE

CROSS REFERENCE TO RELATED APPLICATIONS

This invention is a continuation-in-part of co-pending, commonly-assigned, patent application Ser. No. 07/748,505, filed Aug. 22, 1991, entitled "HIGH DENSITY GRID ARRAY SOCKET."

FIELD OF THE INVENTION

The present invention relates to electronic component sockets, and in particular to a variable density, modular pad array interface.

BACKGROUND OF THE INVENTION

Leadless chip carrier sockets are known, for removably socketing leadless chip carriers or packages which have no protruding electrical leads but which have contact sites or pads to which electrical contact must be made. However, such known leadless chip carrier sockets are not satisfactory in terms of contact reliability, especially where sophisticated packaging results in increasing pin densities and consequently in greater numbers of contacts.

Former technology used plated through-holes or surface mounted IC chips soldered directly to the board. With today's density of chip carriers, these techniques are not easy to achieve. If an IC chip becomes defective, replacing a soldered chip becomes more difficult than using a socket.

Plastic IC chip carriers with high pin count have relatively small leads that are more difficult to solder to a printed circuit board. Extra cost is added to protect IC chip carriers during handling and transportation.

Today's high numbers of closely spaced contacts make it important to protect the leads of the IC chip carrier to maintain their proper position. Damage or misalignment of the chip carrier leads can cause an unreliable electrical connection. With higher speeds of systems, the chip carriers require shorter lead lengths to reduce capacitance and inductance. Current package styles may have no leads.

Prior art using ceramic chip carriers with leads bonded to pads has undesirable built-in capacitance and self-inductance. Additionally, prior art devices manufactured to a predetermined shape do not allow the user flexibility with respect to main circuitboard architecture.

SUMMARY OF THE INVENTION

The present invention is a variable density modular pad array which can be assembled in various configurations. The array generally comprises a leadless component contact socket assembly, a cover, a cover support, insulator assembly and a backup plate. The contact socket assembly can be assembled with a variety of contact terminal end configurations and adapted for a desired mode of circuit board interface. A variety of cover configurations are also accommodated.

Features of the socket according to the invention include a leadless component contact socket assembly comprising a finger slot or slots for facilitating the manual removal of a chip carrier from the socket. A bias clip and socket integral keyed corner are incorporated for assuring proper alignment of the chip carrier with the contact socket assembly.

Additional features of the socket according to the invention include a modular pad array interface for board-to-flex circuit; board-to-board; and board to multi-chip module applications.

DESCRIPTION OF THE DRAWING

These and other features and advantages of the present invention will become apparent in light of the following detailed description of an illustrative embodiment thereof, as illustrated in the accompanying drawing, of which:

FIGS. 11A is a side view of the modular pad array interface of FIG. 10, depicting its use in board-to-flex film and board-to-board applications;

FIG. 11B is a side view of the modular pad array interface of FIG. 10, depicting its use in a board-to-multi-chip application;

DETAILED DESCRIPTION OF THE INVENTION

Figure 1:
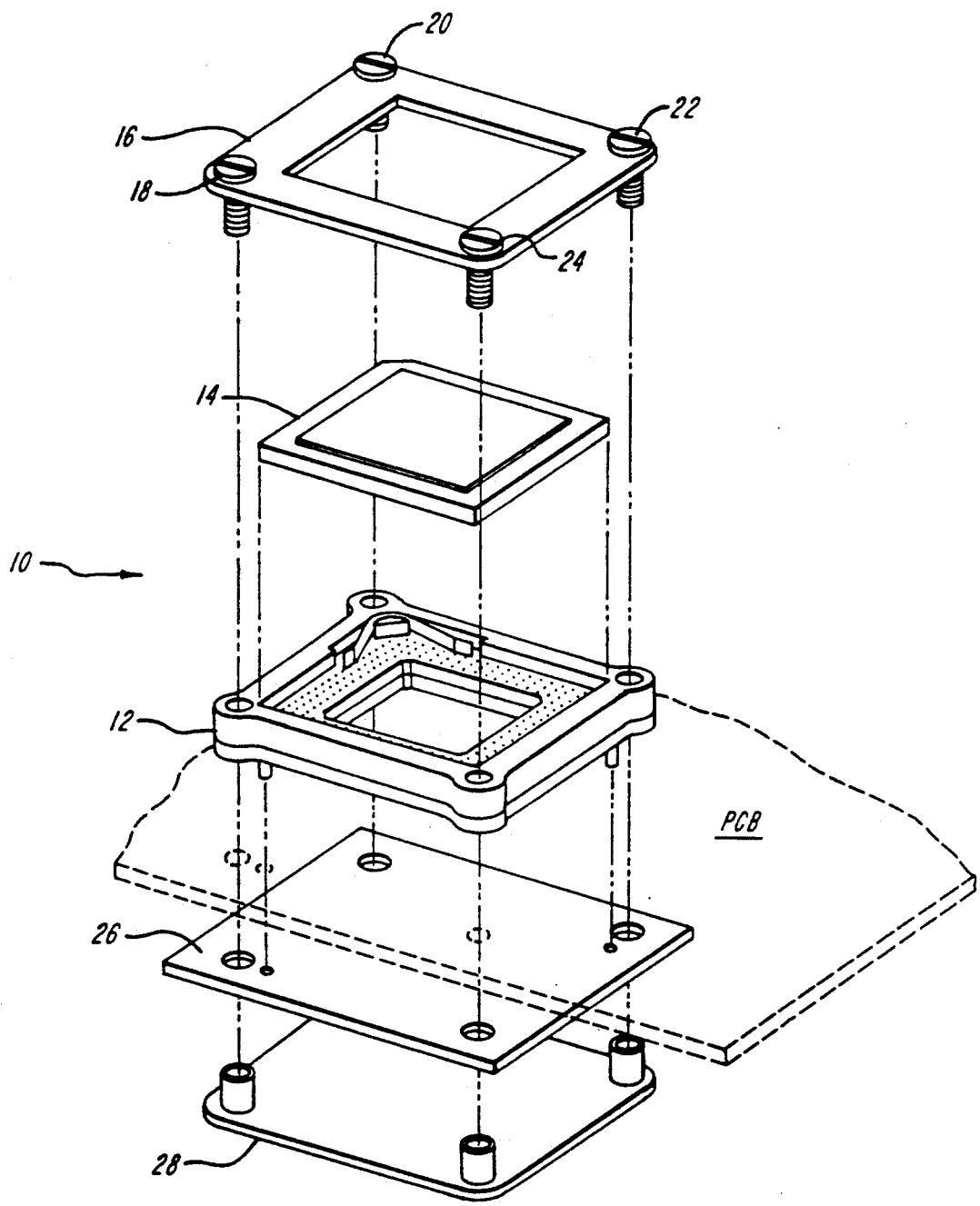
FIG. 1 is an exploded view of a leadless component contact socket according to the invention.

A leadless component contact socket 10, illustrated in FIG. 1, generally comprises a leadless component contact socket assembly 12 which accommodates a leadless chip carrier 14 which is maintained in the contact socket assembly 12 by a cover 16. The cover 16 preferably includes captive hardware, in this case, four screws 18, 20, 22 and 24. Insulation material 26 is disposed proximate to a backup plate 28 or fastener.

Figure 2A:
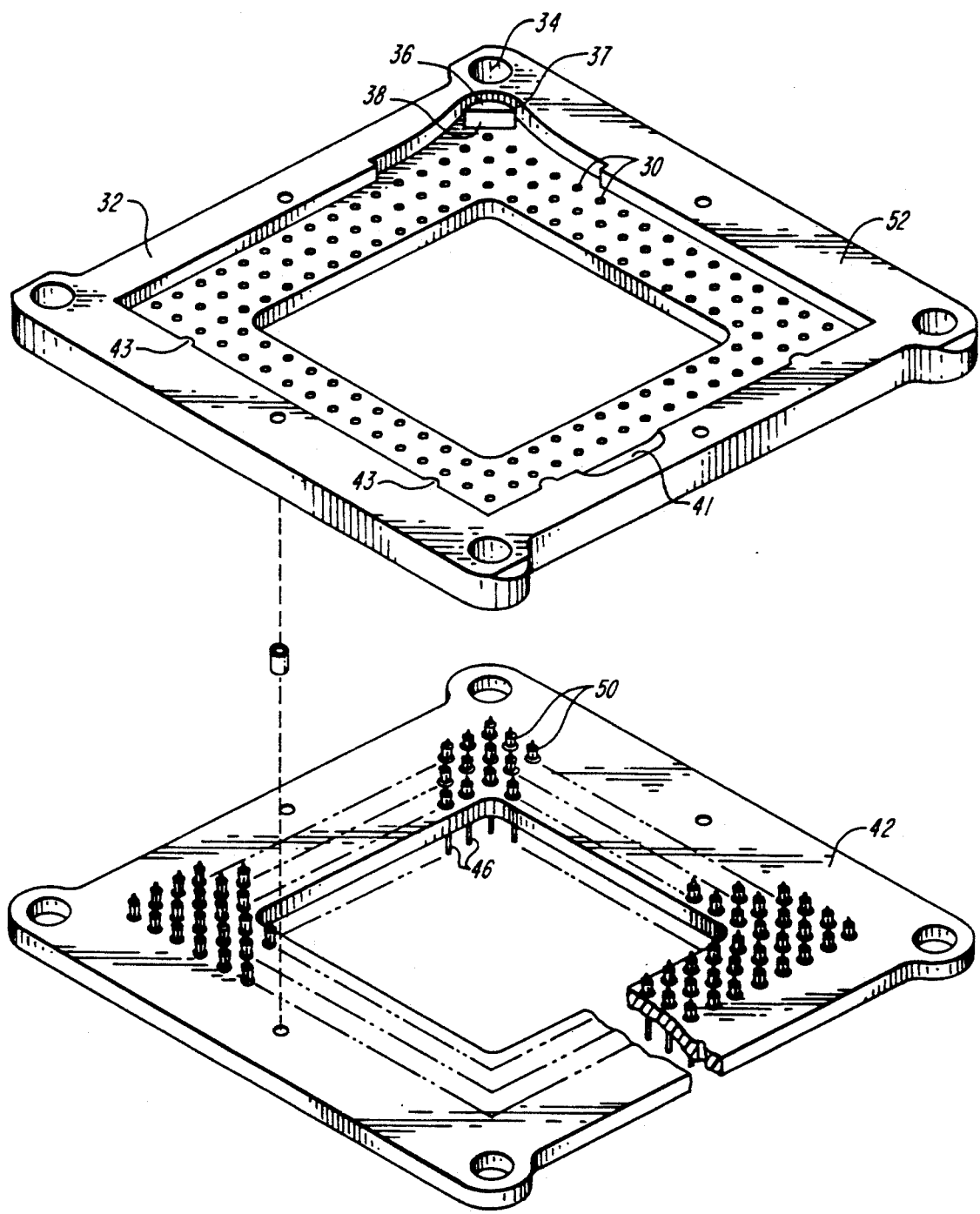
FIG. 2A is a perspective view of a leadless component contact socket assembly of the socket of FIG. 1.
Figure 2B:
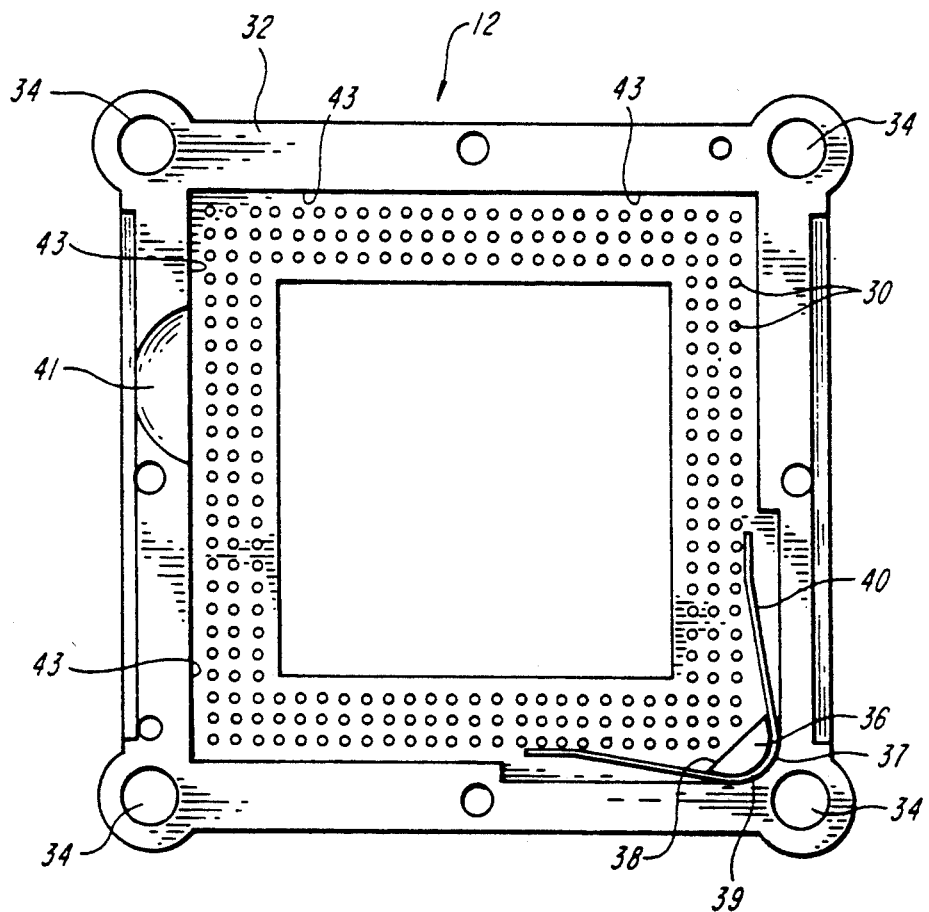
FIG. 2B is a top view of the leadless component contact socket assembly of FIG. 2A.
Figure 4A:
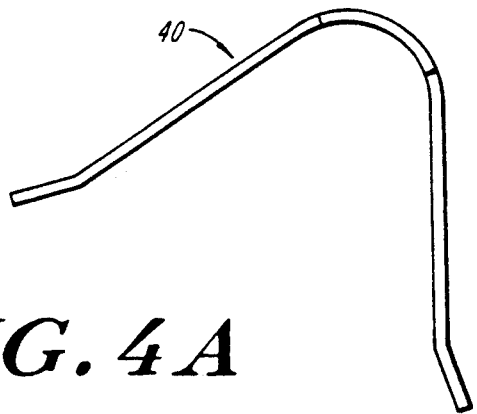
FIGS. 4A, 4B, and 4C are various views of a bias clip of the leadless component contact assembly of FIG. 2A.
Figure 4B:
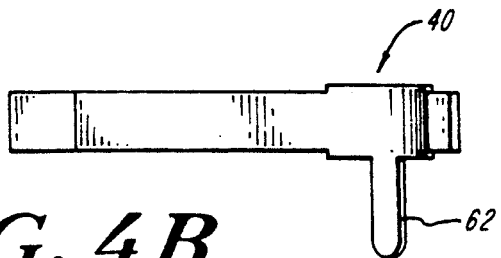
Figure 4C:
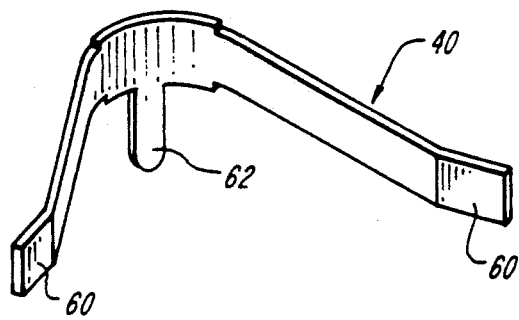

As illustrated in FIGS. 2A and 2B, the leadless component contact socket assembly 12 comprises an array of openings 30 that contain respective two-piece spring contacts, such as described in U.S. Pat. No. 4,838,801 to Bertoglio et al, which is incorporated herein by reference. For integration into a leadless component socket according to the invention, the contact socket assembly 12 comprises a raised outer frame 32 which is substantially rectangular and has screw holes 34 disposed at each corner thereof. A keyed corner piece 36 is integral to the raised outer frame 32 and disposed in one corner as a substantially semicircular member separated from the raised frame 32 by a substantially semicircular channel 37. The top portion of the keyed corner 36 is substantially coplanar with the raised frame 32. An interior surface 38 of the corner 36 serves as an alignment surface for aligning a leadless chip carrier for proper disposition within the contact socket assembly 12. Frame 32 is further provided with a depression 39 about midpoint of the channel 37 located between the keyed corner piece 36 and a corresponding screw hole 34. The channel 37 and depression 39 accommodate a bias clip 40, such as is illustrated in FIGS. 4A-4C and discussed hereinafter. The raised frame 32 is also provided with at least one finger slot 41 which is a depression along an edge of raised frame 32 that permits access to a side of a leadless chip carrier resident in the contact socket assembly, to facilitate fingertip removal of the chip carrier therefrom.

The contact socket assembly 12, as illustrated in FIGS. 2A, 2B and 3A-3C, comprises an insulative base 42 having an array of base openings 44 conforming to the terminal pattern of a leadless chip carrier to be retained in the socket. The base openings 44 accommodate a plunger base 46 which is maintained in the opening by a shoulder 48 that prevents passage of the plunger base 46 through the base opening 44. A contact tip 50 engages the plunger base 46 to effect a spring contact as described in detail in the referenced patent. A top insulative portion 52 having a corresponding array of top openings 54 is disposed on insulative base 42 to form the contact socket assembly 12. The top insulative portion 52 has a plurality of holes 56 integral with the top openings 54 through which the contact tips 50 protrude in the array conforming to the terminal pattern of the device to be retained in the socket.

A variety of contact terminal patterns can be configured in the contact socket assembly by including or excluding contact terminals from selected holes. Further, a variety of types of contact terminals can be configured for a variety of modes of interfacing the socket assembly 12 with a printed circuit board. Plunger bases 46 are illustrated for configuration with printed circuit boards in compression, surface mount and plated through-hole interface modes as in FIGS. 3A through 3C, respectively.

Figure 3A:
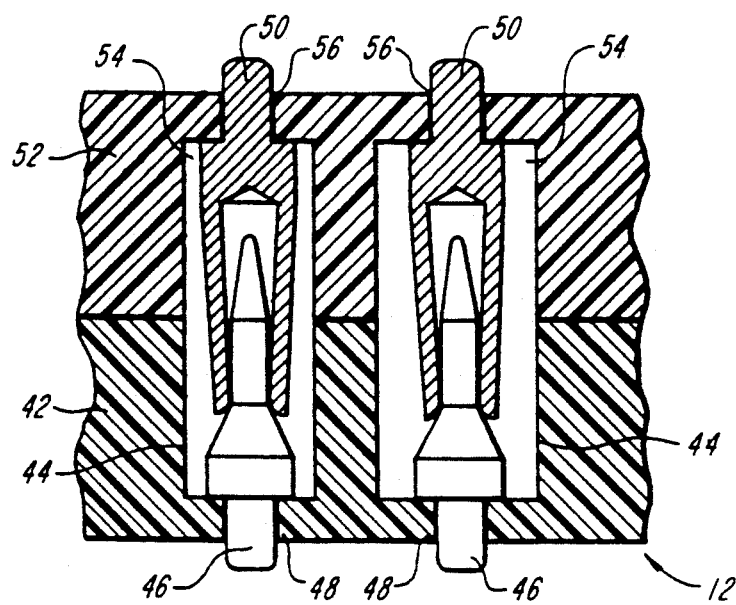
FIGS. 3A, 3B and 3C are side section views of the contact socket assembly of FIG. 2A having compression, surface mount, and through-hole mode terminals disposed therein, respectively.
Figure 3B:
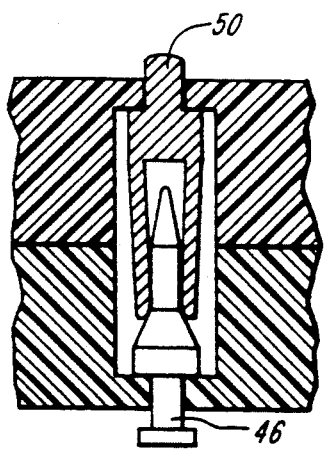
Figure 3C:
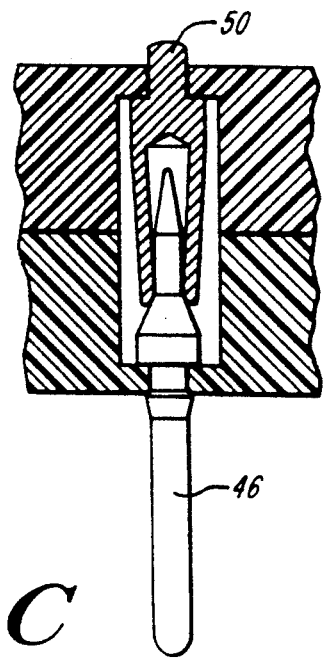
Figure 3D:
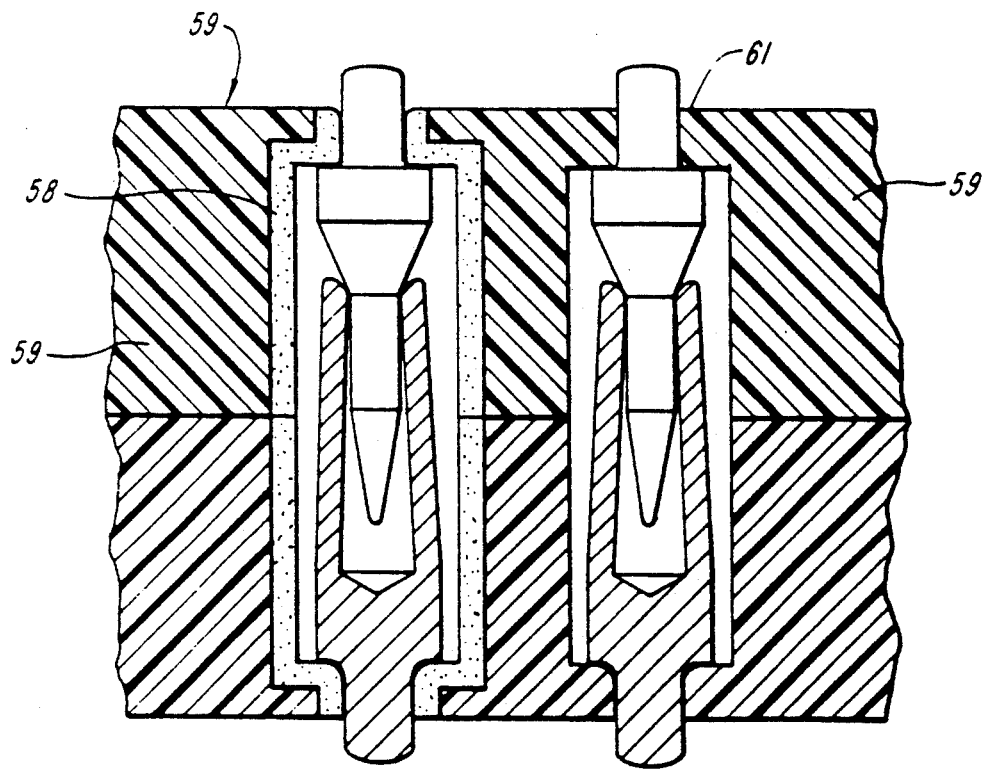
FIG. 3D is a side sectioned view of an embodiment having a dielectric cavity high speed transmission line environment.

Further, the contact socket assembly openings, as illustrated in FIG. 3D, can be provided in a conductive material 59 with a coaxial insulator 58, forming a dielectric cavity in which the contact tip 50 and selected plunger base 46 are enclosed. The dielectric on the interior of the base opening 44 and the top portion opening 54 can be formed of various insulative or dielectric materials or coatings such as polytetrafluoroethylene, nylon, FR4 or the like. Signal integrity is enhanced by creating a transmission line environment for high speed, fast rise time signals. The thickness and/or composition of the dielectric in the cavity can be controlled to obtain desired impedance and/or crosstalk limiting characteristics. While a first contact terminal receptacle is configured with the dielectric cavity for high speed signal transmission, an adjacent cavity 61 is configured without the dielectric to act as a ground/return.

Figure 3E:
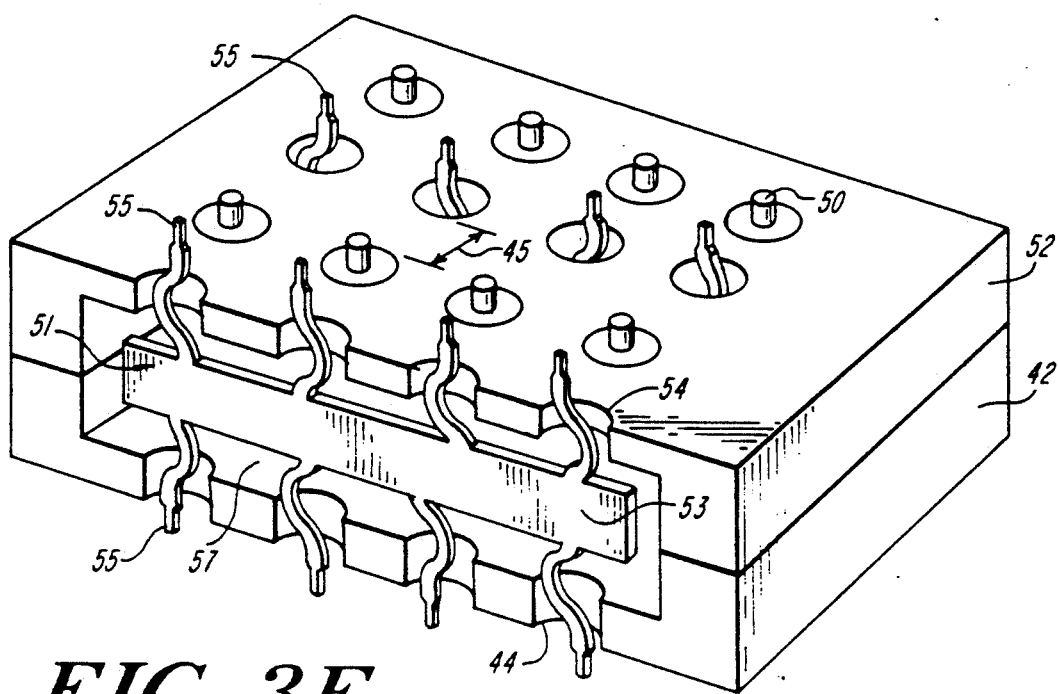
FIG. 3E is a perspective view of an embodiment having a high speed transmission line environment implemented using a compliant bus bar.

FIG. 3e illustrates an alternative transmission line environment implementing another signal integrity enhancement method that can be made to the interconnection socket applications described herein. This method employs a compliant ground/power bus bar approach. The compliant ground/power bus bar 51 will provide a transmission line environment in the interconnection application of high speed, fast rise time signals. This transmission line environment is created by placing a compliant ground/power bus bar in parallel with a row of signal carrying contact tips 50. The compliant bus bar 51 comprises a bus bar 53 having a plurality of compliant contacts 55. The bus bar 53 is disposed within a cavity 57 constructed in the insulative base 42 and the top insulative portion 52 so that compliant contacts 55 extend from the respective base opening 44 and top insulative portion opening 54. A space 45 between the compliant ground/power bus bar and the row of signal carrying contacts can be adjusted to obtain the desired impedance and/or cross talk limiting characteristic. This compliant ground/power bus bar provides a ground reference plane or a power plane that will carry current from the IC chip carrier/multi-chip module substrate to and from the printed circuit board.

Alignment of a leadless component carrier 14 within the contact socket assembly 12, and maintenance of compressive forces on the carrier 14 to ensure electrical interconnection between the carrier and the array of contact tips 50 is effected by a combination of the bias clip 40 and one of a variety of socket covers 16, according to the invention.

The bias clip 40, illustrated in FIGS. 4A-4C, comprises a resilient metal or plastic piece, molded or stamped substantially in a u-shape having two beams of equal length with slight bends at the ends thereof. The bends accommodate sides of the chip carrier package to substantially preclude lateral movement of the chip carrier in the contact socket assembly 12. A post 62 is disposed at about the mid-point of the substantially u-shaped clip 40. The post 62 is dimensioned for disposition within the depression 39 at the mid-point of the channel 37 of the top insulative portion of the contact socket assembly 12. The bias clip 40 is dimensioned to fit snugly within the channel 37 at the corner 36.

A variety of covers 16 are configurable with the leadless contact socket, to coact with the bias clip 40 and maintain the leadless chip carrier installed in the socket assembly 12 in good alignment using alignment bumps 43 with the array of contact pins 30 and with proper electrical interconnection therebetween. A flat cover 16, as illustrated in FIG. 1, has a plurality of captive screws 18, 20, 22, 24 aligned with the holes 34 of the contact socket assembly 12. The captive screws of the flat cover 16 mate with female receptacles integral with a backup plate 28 when the socket is attached to a printed circuit board as discussed hereinafter.

Figure 5A:
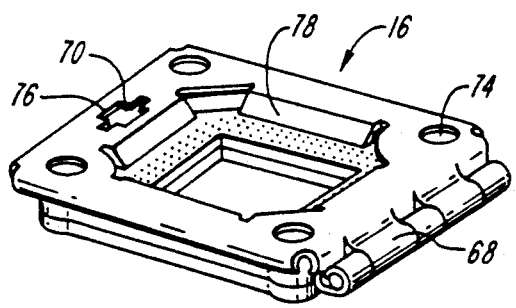
FIGS. 5A, 5B, 5C and 5D are various views of a hinged spring cover assembly adapted for use with the socket of FIG. 1.
Figure 5B:
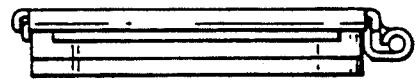
Figure 5C:
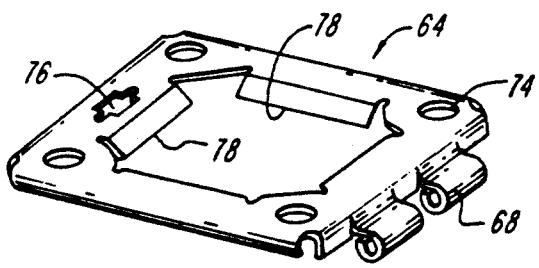
Figure 5D:
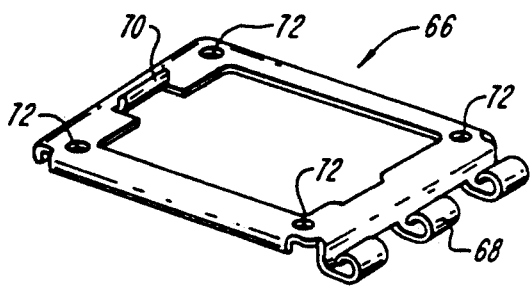

A hinged cover configuration is illustrated in FIGS. 5A-5D. In such a configuration, the cover 16 comprises a hinged spring cover 64 (FIG. 5C) and a mating hinged cover support 66 (FIG. 5D). Both cover 64 and support 66, in this exemplary embodiment, have a plurality of meltable hinge sleeves 68 through which a hinge pin is installed to mate the cover 64 and cover support 66, as illustrated in FIG. 5A. The cover support 66 has an integral latch 70 and four screw holes 72 which align with the screw holes 34 in the contact socket assembly 12. The hinged cover 64 has a matching set of screw holes 74 which are sized larger than the support screw holes 72 so that screws captive in the support 66, in a manner as known in the art, appear counter sunk in the assembled cover or flush therewith. The cover 64 has a latch slot 76 configured to mate with the latch 70 on the support 66 to maintain the assembled cover in a closed position. A plurality of cover beams 78, preferably one on each side of the cover 64 extend downwardly and are dimensioned to put sufficient force on a chip carrier aligned in the contact socket assembly 12 to keep the chip carrier in good alignment and to maintain proper electrical interconnection between the array of contact pins 50 and the leadless component carrier contacts.

An alternative hinged cover configuration, illustrated in FIGS. 6A-6e, has a plurality of hinge flaps 80 on an eared cover top 82 and a corresponding plurality of hinge slots 84 on an eared support or base 86 for receipt of the flaps 80. Opposing ears 88, 90 on the base 86 have screw holes therein which are aligned with holes on opposing ears 92, 94 on the cover top 82. The aligned screw holes on the ears facilitate closure and fastening of the top 82 to the base 86. Like the hinged embodiment disclosed in FIGS. 5A-5D and 6A-6D, the eared cover has a plurality of cover beams 94 on the top 82, for keeping an installed chip carrier in good alignment and proper electrical interconnection with the array of contact pins 50 of the contact socket assembly 12.

Figure 6A:
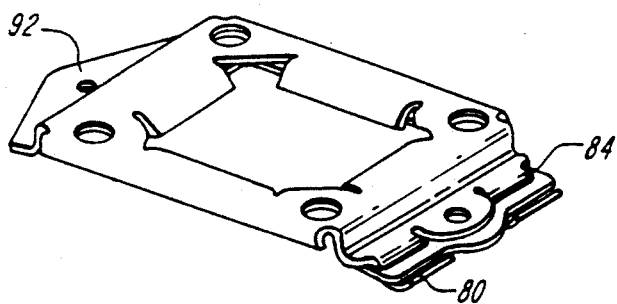
FIGS. 6A, 6B, 6C and 6D are various views of another embodiment of a hinged spring cover assembly.
Figure 6B:
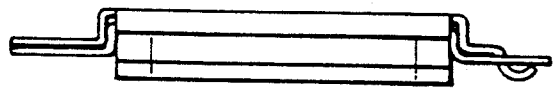
Figure 6C:
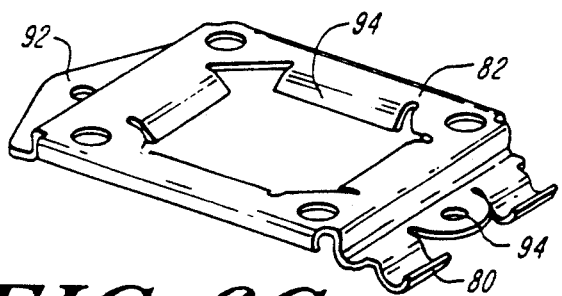
Figure 6D:
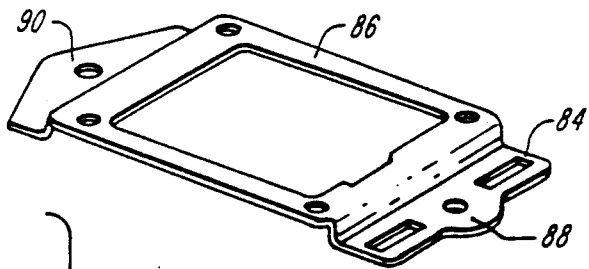
Figure 6E:
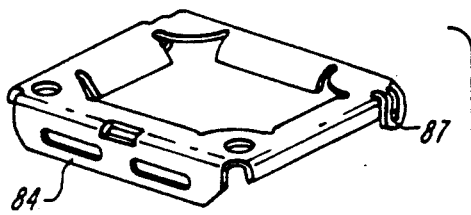
FIG. 6E is another hinged cover embodiment.
Figure 6E:
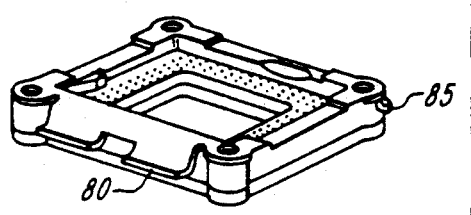

A non-eared hinged cover is illustrated in FIG. 6e, wherein hinge flaps 80 and hinge slots 84 are opposed by a protrusion 85 and hook lock 87, respectively, to maintain the cover in a closed position.

Figure 7:
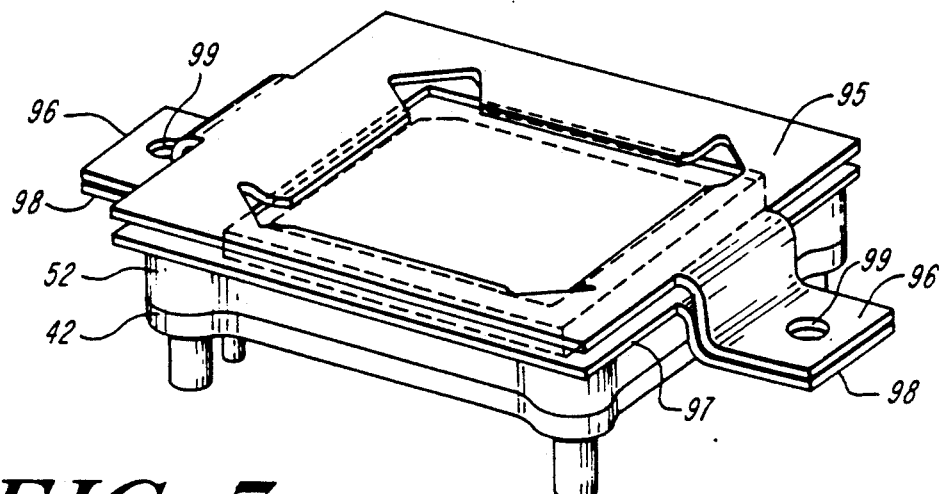
FIG. 7 is a perspective view of a spring cover with ears fastened to a spring cover support.
Figure 8:
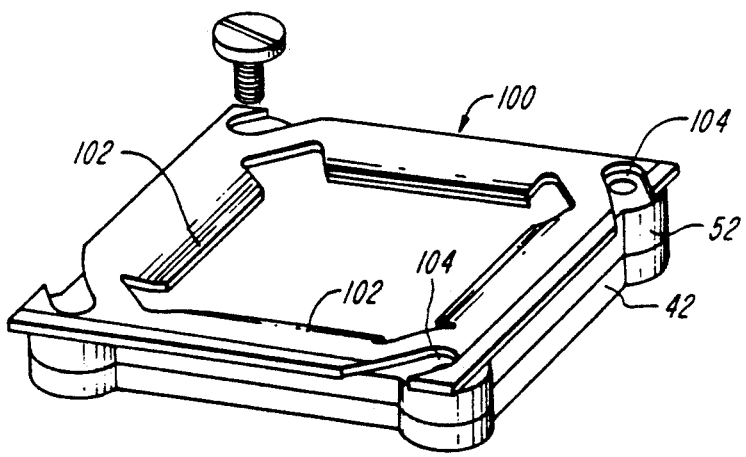
FIG. 8 is a perspective view of a rotating spring cover.

Still other embodiments of covers for the high density socket according to the invention, are illustrated in FIGS. 7 and 8. A non-hinged spring cover 95 with ears 96 fastened to a non-hinged cover support 97 with ears 98 is shown in FIG. 7. The cover is attached to the contact socket assembly 12 by screws holding down the cover support with ears. The screws protrude from the base of the contact socket assembly so that they can be fastened to a backup plate (not shown) through an insulation material. The ears on the cover have holes 99 through which removable fastening devices are employed to fasten the cover 96 to the cover support 98.

A rotatable spring cover 100, FIG. 8, is a one-piece cover providing spring beam compression and ease of installation. The single piece rotatable cover has four spring beams 102, like the other non-flat covers described hereinbefore, which extend downwardly for alignment and retention of an installed chip carrier. The cover has four corner cut-outs 104 that accommodate the shaft of a screw, which is captively installable in the contact socket assembly 12, so that the rotating cover 100 is attachable to the contact socket assembly 12 by rotating the cover so that the cut-outs 104 engage the screw shafts. The screws can then be tightened down to retain the cover in place.

Figure 9:
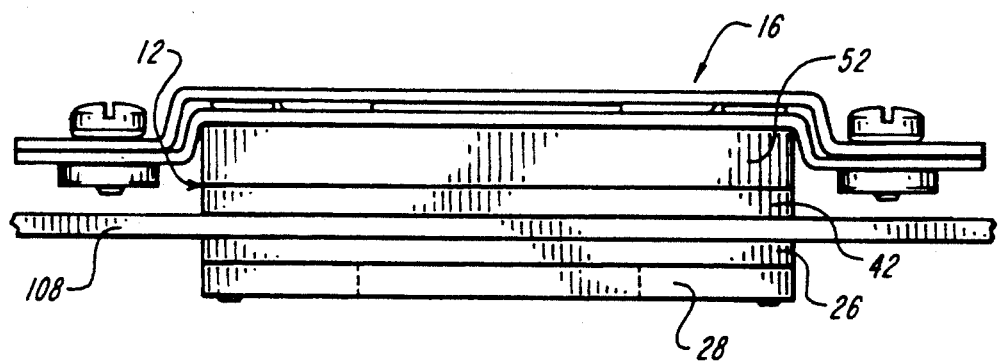
FIG. 9 is a side elevation view of the leadless component contact socket of FIG. 7 disposed on a printed circuit board.

Referring now to FIGS. 1 and 9, the high density contact socket according to the invention is implemented by installing a leadless chip carrier or multichip package 14 in the leadless component contact socket assembly 12, in alignment with the array of contact tips 50. Alignment is facilitated by the corner 36 and the bias clip 40. A selected cover and accompanying captive screws are aligned by directing the screws through the holes 34 in the contact socket assembly and through corresponding holes in a printed circuit board 108 onto which the socket is mounted. Preferably, the socket is aligned on the printed circuit board mateable receptacles which accommodate either compression, through-hole or surface mount techniques, as known in the art.

Figure 8A:
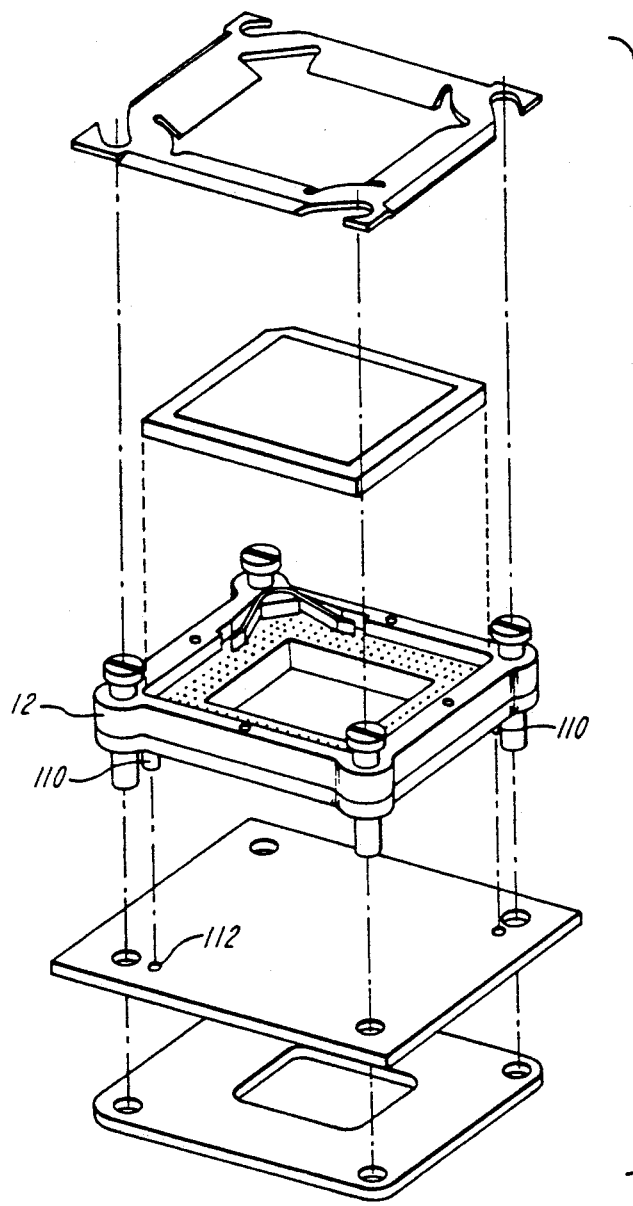
FIG. 8A is an exploded view of a contact socket having the rotating cover of FIG. 8.
Figure 8B:
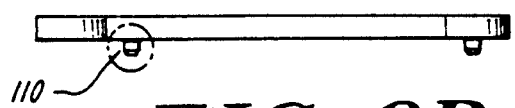
FIG. 8B is a side view of a portion of an insulative member having location posts on a bottom surface.
Figure 8C:
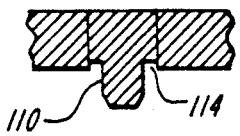
FIG. 8C is a side sectioned view of a location post and depression thereabout.

Location posts 110, as illustrated in FIGS. 8A-8C, are included on a bottom side of the insulative portion of the contact socket assembly. The location posts engage and align the socket with corresponding holes 112 in the printed circuit board on which the socket is mounted. Preferably, the posts 110 are dimensioned having a depressed radius 114 thereabout which is counter sunk below the bottom surface to minimize breakage of the posts. The depressed radius 114 also serves as a void in which particles of circuit board material or skived plastic may go during alignment and installation so that the socket sits flush on the circuit board having the proper electrical engagement therewith.

Insulation material 26 may be installed between the backup plate 28 and the printed circuit board 108 (the insulation material is attached to the backup plate using adhesive). The socket is fastened to the circuit board by fastening the screws captive in the selected cover, to the back-up plate 28 which has threaded holes to receive the captive screws.

Alternative hardware can be used to fasten the socket assembly to the printed circuit board and if an insulative material is used for the back-up plate, the insulation material 26 can be eliminated.

Although several embodiments of covers are disclosed herein, various other cover embodiments can be employed to suit specific operational requirements.

While the raised outer frame 32 and the keyed corner 36 are described as rectangular and semicircular, respectively, it can be appreciated that alternative geometries and dimensions can be implemented.

Although the socket is described as having a bias clip and keyed corner in the same corner for chip alignment, it can be appreciated that the clip could be in one corner while the key for chip polarization could be in a separate corner.

Figure 10:
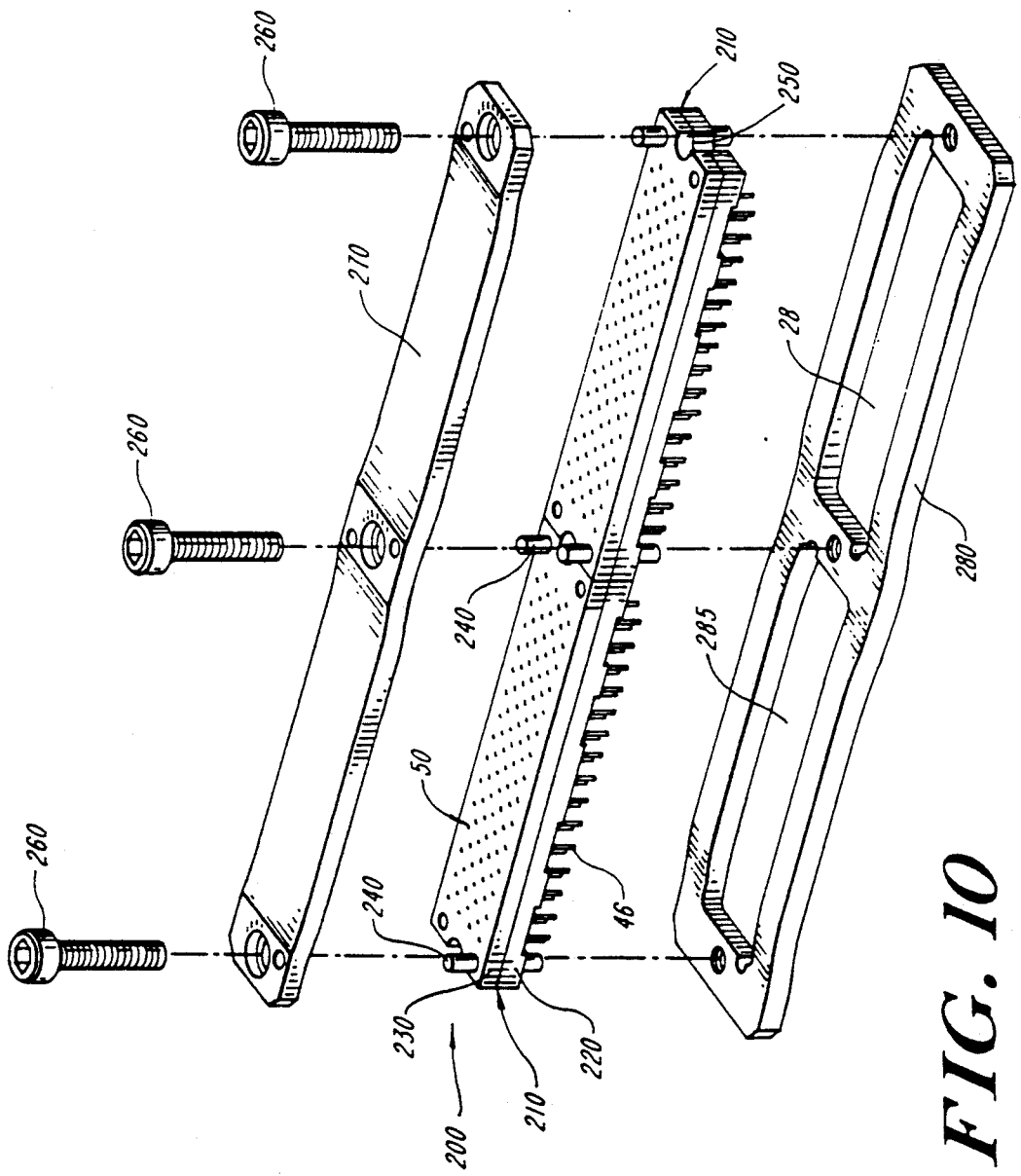
FIG. 10 is an exploded view of a modular pad array interface.
Figure 12A:
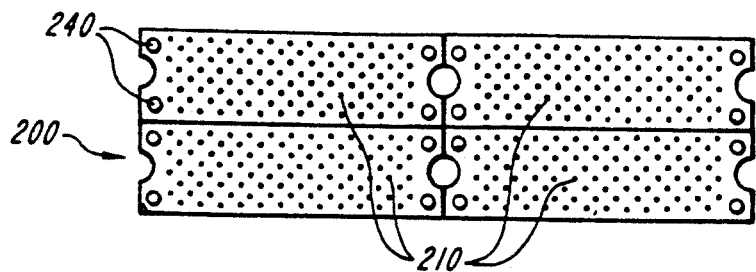
FIG. 12A is a plan view of a modular pad array interface in a side by side configuration.
Figure 12B:
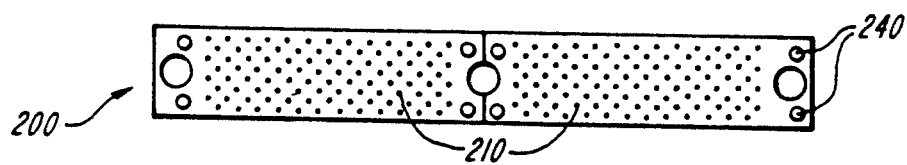
FIG. 12B is a plan view of a modular pad array interface in an end to end configuration.
Figure 12C:
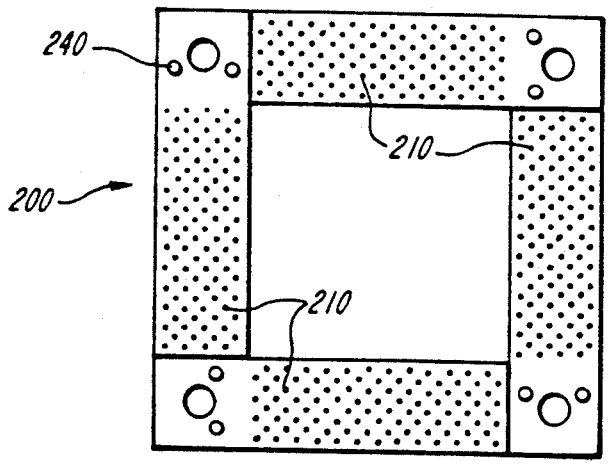
FIG. 12C is a plan view of a modular pad array interface in a square implemented with modular blocks in an end-to-side configuration.
Figure 12D:
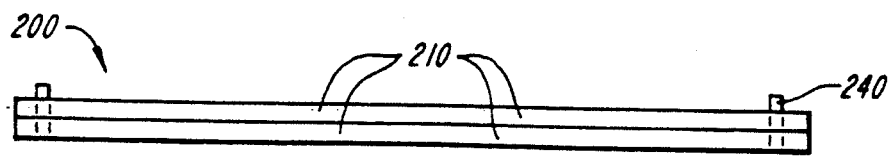
FIG. 12D is a plan view of a modular pad array interface in a stacked configuration.

An alternative embodiment of the contact socket assembly 12 is depicted in FIG. 10, wherein an exploded view of a modular pad array interface 200 is shown. The modular pad array interface 200 is a variable density interconnect system for the connection of high speed signals between parallel as well as perpendicular surfaces. This embodiment is configurable so that the footprint sizes and patterns of the array 200 are limited only by the end users space requirements. The modular nature of the array 200 permits several individual interface blocks 210 to be arranged side by side, end to end, in a square, stacked, or in any other configuration of choice, such as illustrated in FIGS. 12A, 12B, 12C and 12D respectively. An alignment feature 240 reduces the possibility of improper mating of the electrical connectors. Precision alignment enables the device manufacturer to eliminate the leads on the device and to reduce costs.

Referring now to FIG. 10, each of the modular pad array blocks 210 comprises a lower insulator 220 having an array of base openings 44 accommodating a plunger base 46 maintained in the opening by a shoulder 48 that prevents passage of the plunger base 46 through the base opening 44, as depicted in FIG. 3A. A contact tip 50, retained in an upper insulator 230 in a manner similar to that of the plunger base 46, engages the plunger base 46 to effect a spring contact as described in detail in the referenced patent. The input/output contacts 46 may be arranged in various patterns in various densities such as 0.050×0.050, 0.100×0.100, 0.060×0.060, 075×0.075, and 0.025×0.025. Various embodiments of these contacts are illustrated in FIGS. 3A, 3B, and 3C.

With reference again to FIG. 10, an array 200 is configured with two blocks 210 end to end. In the illustrative embodiment, each connector block 210 has two alignment posts 240 diagonally opposed and protruding outward from the upper and lower insulators 230, 220. These alignment posts 240 can be metal posts friction fit into a hole on a top surface of the insulative portion of the connector blocks which align the conductive contacts 46, 50 of the array 200 with specified contacts or conductive elements on the flex circuit or printed circuit board to be conductively joined. Additionally, the relief in the base portion ensures that possible plastic skiving will not interfere with the seating or connection.

Each block 210 has semicircular recess 250 at opposing ends of the block 210 suitably sized to accept fastening screws 260. The fastening screws 260 when used in conjunction with a top and bottom support or clamp plate 270, 280 hold the array 200 in place and ensure conductive contact is maintained between the array 200 and the conductive elements on the flex circuit or printed circuit board to be conductively joined to the array. As shown in FIG. 10, the bottom support plate 40 has openings 285 which allow unobstructed passage for the input/output contacts 46. The top support plate 270 is shown without openings to provide uniform support or pressure along its length. However, a top support plate 270, can have openings (not shown) similar to the openings 285 of the bottom plate 280, which would be employed in multi-chip applications as depicted in FIG. 11B, or any other application where unrestricted access to the upper surface of the array 200 is desirable.

When tightened, the fastening screws 260 press the top support plate 270 and the bottom support plate 280 together, which in turn presses electrical contacts on the board or flex circuit engaged into intimate contact with the contacts 46, 50 of the array 200. A similar result may be achieved with support plates 270, 280 adapted for use with clips replacing the screws 260. The result is a connector with a lower profile than prior art devices. The materials and shape of the support plates 270, 280 may vary widely, to include both metals and plastics, depending on the shape of the array 200 and the support requirements.

Referring to FIG. 11A an embodiment is shown which is suitable to board-to-flex circuit and board-to board applications. In this example four blocks 210 laid end to end with pad style contacts 46, 50 form the array 200. The support plates 270, 280 and screws 260 are shown tightened. The compressed support plates 270, 280 thus hold the lower contacts 46 of the array 200 in contact with plated compression pads on a circuit board 290, or PC tails into plated thru-holes, and press the flex circuit (as known in the art) or daughter board 300 having electrical contact pads onto the upper contact pads 50 of the blocks 210. The use of compression mount pads 50 creates shorter signal paths with lower inductance. Furthermore, the device as described allows a controlled impedance/matched impedance connection, and is able to withstand many more connect and disconnect cycles.

Another application of the pad array interface 200 in a multi-chip module arrangement is depicted in FIG. 11B. Here the array 200 comprises two blocks 210 laid end to end and employs compression pad interfaces for upper contacts 50 with a daughterboard 300 having another electronic component 310 installed thereon. In this configuration the daughter board is easily separated from the motherboard by removing the support plate 270 to permit removal and installation of components 310.

Although screws are shown as the engagement means, one of ordinary skill in the art would appreciate that support plates can be engaged by other means such as clips, rivets and the like.

Finally, while the invention has been shown and described with respect to an illustrative embodiment thereof, it should be understood by those skilled in the art that other various changes, omissions and additions in the form and detail thereof may be made without departing from the spirit and scope of the invention as delineated in the claims.

What is claimed is:

1. A modular pad array interface comprising:
   a plurality of modular substantially rectangular low profile connector blocks each having a side length, an end width and a height, said height being less than each of said length and width and said end width being less than said side length and having an insulative portion, said insulative portion having a plurality of holes disposed therein, said plurality of connector blocks being alternatively configurable in end-to-end, side-to-side and end-to-side configuration for location between and electrical interconnection with opposed circuit members in any of said configurations;
   a plurality of resilient contacts disposed in at least some of said plurality of holes, said plurality of resilient contacts comprising a separable contact tip and a contact base;
   at least one alignment member disposed in at least one of said plurality of connector blocks;
   a bottom clamp plate and a top clamp plate adapted for connection with at least one of said plurality of connector blocks said bottom and top clamp plates being aligned with said plurality of connector blocks by said at least one alignment member; and
   an engagement member for maintaining said connector blocks and said bottom clamp plate and said top clamp plate in mechanical engagement with a circuit board clamped between said plurality of connector blocks and said bottom clamp plate.

2. The modular pad array interface of claim 1, wherein said connector blocks are arranged side to side.

3. The modular pad array interface of claim 1, wherein said connector blocks are arranged end to end.

4. The modular pad array interface of claim 1, wherein said connector blocks are arranged side to end.

5. The modular pad array of claim 1 wherein said engagement member comprises screws.

6. The modular pad array interface of claim 1 wherein said connector blocks are adapted for mating with at least one daughter aboard.

7. The modular pad array of claim 1 wherein said connector blocks are adapted for mating with a plurality of contacts disposed on at least one flex circuit.

8. The modular pad array interface of claim 1 wherein said contact base of said plurality of resilient contacts is adapted for surface mount interconnection with a printed circuit board.

9. The modular pad array interface claim 1 wherein said contact base of said plurality of resilient contacts is adapted for compression interconnection with at least one printed circuit board conductor.

10. The modular pad array interface of claim 1 wherein said contact base of said plurality of resilient contacts is adapted for through-hole interconnection with at least one printed circuit board conductor.

11. The modular pad array interact of claim 1 wherein said at least one alignment member comprises two diagonally opposed alignment posts extending orthogonally from a surface of said insulative portion of each of said plurality of connector blocks.

12. The modular pad array interface of claim 1, wherein said alignment member is an integral structural element of said insulative portion.

13. The modular pad array interface of claim 1 wherein said top clamp plate comprises at least one member applying sufficient pressure on one of a flex circuit and a printed circuit board installed on said plurality of connector blocks to substantially ensure adequate electrical interconnection between electrical contacts on one of said flex circuit and printed circuit board and said plurality of resilient contacts.

14. The modular pad array interface of claim 1 wherein said alignment member is a metal post that is friction fit into a hole on a top surface of said insulative portion.

* * * * *

UNITED STATES PATENT AND TRADEMARK OFFICE
CERTIFICATE OF CORRECTION

PATENT NO. : 5,221,209
DATED : June 22, 1993
INVENTOR(S) : Richard J. D'Amico

It is certified that error appears in the above-indentified patent and that said Letters Patent is hereby corrected as shown below:

Column 5, line 11, "meltable" should read --mateable--.

Column 9, line 5, "daughter aboard" should read --daughter board--.

Signed and Sealed this

Twenty-third Day of August, 1994

Attest:

BRUCE LEHMAN

Attesting Officer      Commissioner of Patents and Trademarks